(12) United States Patent
Zhu et al.

(10) Patent No.: US 12,348,199 B2
(45) Date of Patent: Jul. 1, 2025

(54) RADIO FREQUENCY CIRCUIT HAVING A LINEARIZER

(71) Applicant: Skyworks Solutions, Inc., Irvine, CA (US)

(72) Inventors: Yu Zhu, Wellesley, MA (US); Oleksiy Klimashov, Burlington, MA (US); Dylan Charles Bartle, Arlington, MA (US); Paul T. DiCarlo, Marlborough, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 257 days.

(21) Appl. No.: 18/161,473

(22) Filed: Jan. 30, 2023

(65) Prior Publication Data

US 2023/0253936 A1 Aug. 10, 2023

Related U.S. Application Data

(60) Provisional application No. 63/306,213, filed on Feb. 3, 2022.

(51) Int. Cl.
*H03F 3/24* (2006.01)
*H03H 11/04* (2006.01)
*H03K 17/687* (2006.01)

(52) U.S. Cl.
CPC ............. *H03F 3/245* (2013.01); *H03H 11/04* (2013.01); *H03K 17/687* (2013.01); *H03F 2200/451* (2013.01)

(58) Field of Classification Search
CPC ....................................... H03F 3/245
USPC ............................................ 327/574
See application file for complete search history.

(56) References Cited

U.S. PATENT DOCUMENTS 6,138,042 A * 10/2000 Midya .................. H03F 1/0227
455/571
2018/0091136 A1* 3/2018 Wang .................. H10D 86/201

* cited by examiner

*Primary Examiner* — Tomi Skibinski
(74) *Attorney, Agent, or Firm* — Knobbe, Martens, Olson & Bear, LLP

(57) ABSTRACT

The present disclosure relates to a radio frequency circuit comprising a linearizer circuit. The linearizer circuit may comprise a first capacitor and a second capacitor arranged in parallel. The first capacitor may have a positive third order derivative of charge with respect to voltage. The second capacitor may have a negative third order derivative of charge with respect to voltage. Related radio frequency modules and wireless communication devices are also disclosed.

20 Claims, 10 Drawing Sheets

RADIO FREQUENCY CIRCUIT HAVING A LINEARIZER

INCORPORATION BY REFERENCE TO ANY PRIORITY APPLICATIONS

This application claims priority to U.S. Provisional Application No. 63/306,213, filed on Feb. 3, 2022 and titled "RADIO FREQUENCY CIRCUIT HAVING A LINEARIZER," the disclosure of which is hereby incorporated by reference in its entirety for all purposes. Any and all applications for which a foreign or domestic priority claim is identified in the Application Data Sheet as filed with the present application are hereby incorporated by reference under 37 CFR 1.57.

BACKGROUND

Field

Embodiments of the present disclosure relate to a radio frequency (RF) circuit having a linearizer, such as one or more of an RF power amplifier circuit, an RF power mixer circuit and an RF filter circuit. More particularly, at least some embodiments are directed to radio frequency modules and wireless communication devices having one or more linearizers.

Description of the Related Technology

Intermodulation (IM) or intermodulation distortion (IMD) is a common problem, which can arise from one or more nonlinearities in a signal processing system. Linearity can be a significant performance parameter, for example, in a power amplifier system that is configured to transmit signals in a plurality of different frequency bands.

Demands are increasing in semiconductor and electronics devices to support radio-frequency applications with high linearity in the transmission and handling of RF signals. Switches used in the amplification and/or transmission of RF signals may experience nonlinearity, leading to harmonic distortion in an output signal of a communication system. A need exists to reduce or eliminate such nonlinearity and subsequent harmonic distortion, while keeping the size and cost of such switches low.

SUMMARY

According to certain embodiments, there is provided a radio frequency circuit comprising a linearizer circuit. The linearizer circuit comprises a first capacitor and a second capacitor arranged in parallel. The first capacitor has a positive third order derivative of charge with respect to voltage. The second capacitor has a negative third order derivative of charge with respect to voltage.

In certain examples, the linearizer circuit has a total third order derivative of charge with respect to voltage, which is the sum of the third order derivative of charge with respect to voltage of the first capacitor and the third order derivative of charge with respect to voltage of the second capacitor.

In certain examples, the third order derivative of charge with respect to voltage of the first capacitor has an absolute value within 50 percent of an absolute value of the third order derivative of charge with respect to voltage of the second capacitor. By way of illustration only, the absolute value of the third order derivative of charge with respect to voltage of the first capacitor would be between 4 and 12 when the absolute value of the third order derivative of charge with respect to voltage of the second capacitor is 8.

The third order derivative of charge with respect to voltage of the first capacitor may have an absolute value of within 30 percent, 20 percent, 10 percent or 5 percent of an absolute value of the third order derivative of charge with respect to voltage of the second capacitor.

In certain examples, the absolute value of the third order derivative of charge with respect to voltage of the first capacitor is substantially the same as the absolute value of the third order derivative of charge with respect to voltage of the second capacitor.

In certain examples, the radio frequency circuit further comprises an input and an output. The linearizer circuit may have a first terminal arranged between the input and the output of the radio frequency circuit. The first capacitor may have a first terminal connected to the first terminal of the linearizer circuit. The second capacitor may have a first terminal connected to the first terminal of the linearizer circuit.

In certain examples, the first capacitor may have a second terminal connected to ground. The second capacitor may have a second terminal connected to ground.

In certain examples, the first capacitor is a metal-insulator-metal (MIM) capacitor.

In certain examples, the second capacitor is a metal-insulator-metal (MIM) capacitor.

In certain examples, the first capacitor comprises a pair of polarized capacitors arranged anti-parallel to one another. Each polarized capacitor may be a metal-insulator-metal (MIM) capacitor. The third order derivative of charge with respect to voltage of the first capacitor may be the sum of the third order derivative of charge with respect to voltage of the pair of polarized capacitors.

In certain examples, the second capacitor comprises a pair of polarized capacitors arranged anti-parallel to one another. Each polarized capacitor may be a metal-insulator-metal (MIM) capacitor. The third order derivative of charge with respect to voltage of the second capacitor may be the sum of the third order derivative of charge with respect to voltage of the pair of polarized capacitors.

According to certain embodiments, there is provided a radio frequency circuit, comprising a switch circuit. The switch circuit comprises a field effect transistor and a capacitor arranged in parallel. The field effect transistor has a positive third order derivative of charge with respect to voltage when the field effect transistor is in an off state. The capacitor has a negative third order derivative of charge with respect to voltage.

In certain examples, the switch circuit has a total third order derivative of charge with respect to voltage, which is the sum of the third order derivative of charge with respect to voltage of the field effect transistor when the field effect transistor is in an off state, and the third order derivative of charge with respect to voltage of the capacitor.

In certain examples, the third order derivative of charge with respect to voltage of the field effect transistor when the field effect transistor is in an off state has an absolute value within 50 percent of an absolute value of the third order derivative of charge with respect to voltage of the capacitor. By way of illustration only, the absolute value of the third order derivative of charge with respect to voltage of the field effect transistor (when the field effect transistor is in an off state) would be between 4 and 12 when the absolute value of the third order derivative of charge with respect to voltage of the capacitor is 8.

The third order derivative of charge with respect to voltage of the field effect transistor (when the field effect transistor is in an off state) may have an absolute value of within 30 percent, 20 percent, 10 percent or 5 percent of an absolute value of the third order derivative of charge with respect to voltage of the capacitor.

In certain examples, the absolute value of the third order derivative of charge with respect to voltage of the field effect transistor when the field effect transistor is in an off state is substantially the same as the absolute value of the third order derivative of charge with respect to voltage of the capacitor.

In certain examples, the radio frequency circuit further comprises an input and an output. The switch circuit may have a first terminal arranged between the input and the output of the radio frequency circuit. The field effect transistor may have a first terminal connected to the first terminal of the linearizer circuit. The capacitor may have a first terminal connected to the first terminal of the linearizer circuit.

In certain examples, the field effect transistor has a second terminal connected to ground. The capacitor may have a second terminal connected to ground.

In certain examples, the field effect transistor is a shunt off field effect transistor.

In certain examples, the capacitor is a metal-insulator-metal (MIM) capacitor.

In certain examples, the radio frequency circuit is provided as part of one or more of a radio frequency power amplifier circuit, a radio frequency power mixer circuit and a radio frequency filter circuit.

According to certain embodiments, there is provided a radio frequency module comprising a radio frequency circuit having a linearizer circuit. The linearizer circuit comprises a first capacitor and a second capacitor arranged in parallel. The first capacitor has a positive third order derivative of charge with respect to voltage. The second capacitor has a negative third order derivative of charge with respect to voltage.

According to certain embodiments, there is provided a radio frequency module comprising a radio frequency circuit having a switch circuit. The switch circuit comprises a field effect transistor and a capacitor arranged in parallel. The field effect transistor has a positive third order derivative of charge with respect to voltage when the field effect transistor is in an off state. The capacitor has a negative third order derivative of charge with respect to voltage.

According to certain embodiments, there is provided a wireless communication device comprising a radio frequency circuit having a linearizer circuit. The linearizer circuit comprises a first capacitor and a second capacitor arranged in parallel. The first capacitor has a positive third order derivative of charge with respect to voltage. The second capacitor has a negative third order derivative of charge with respect to voltage.

According to certain embodiments, there is provided a wireless communication device comprising a radio frequency circuit having a switch circuit. The switch circuit comprises a field effect transistor and a capacitor arranged in parallel. The field effect transistor has a positive third order derivative of charge with respect to voltage when the field effect transistor is in an off state. The capacitor has a negative third order derivative of charge with respect to voltage.

In some aspects, the techniques described herein relate to a radio frequency circuit including: a radio frequency module including a linearizer circuit, the linearizer circuit including a first capacitor and a second capacitor arranged in parallel, the first capacitor having a positive third order derivative of charge with respect to voltage, the second capacitor having a negative third order derivative of charge with respect to voltage; and a power amplifier circuit including a power amplifier configured to amplify a radio frequency signal for transmission, the radio frequency module configured to reduce intermodulation distortion during operation of the power amplifier.

In some aspects, the techniques described herein relate to a radio frequency circuit wherein the linearizer circuit has a total third order derivative of charge with respect to voltage corresponding to a sum of the positive third order derivative of charge with respect to voltage of the first capacitor and the negative third order derivative of charge with respect to voltage of the second capacitor.

In some aspects, the techniques described herein relate to a radio frequency circuit wherein the positive third order derivative of charge with respect to voltage of the first capacitor has an absolute value within 50 percent of an absolute value of the negative third order derivative of charge with respect to voltage of the second capacitor.

In some aspects, the techniques described herein relate to a radio frequency circuit wherein an absolute value of the positive third order derivative of charge with respect to voltage of the first capacitor is substantially the same as an absolute value of the negative third order derivative of charge with respect to voltage of the second capacitor.

In some aspects, the techniques described herein relate to a radio frequency circuit further including an input circuit and an output circuit, the linearizer circuit having a first terminal arranged between the input circuit and the output circuit, the first capacitor having a first terminal connected to the first terminal of the linearizer circuit, and the second capacitor having a first terminal connected to the first terminal of the linearizer circuit.

In some aspects, the techniques described herein relate to a radio frequency circuit wherein the first capacitor has a second terminal connected to ground, and the second capacitor has a second terminal connected to ground.

In some aspects, the techniques described herein relate to a radio frequency circuit wherein the first capacitor is a metal-insulator-metal (MIM) capacitor and the second capacitor is a metal-insulator-metal (MIM) capacitor.

In some aspects, the techniques described herein relate to a radio frequency circuit wherein the first capacitor is one of a first pair of polarized capacitors arranged anti-parallel to one another, and the second capacitor is one of a second pair of polarized capacitors arranged anti-parallel to one another.

In some aspects, the techniques described herein relate to a switch circuit including: a field effect transistor having a positive third order derivative of charge with respect to voltage when the field effect transistor is in an off state; and a capacitor arranged in parallel with the field effect transistor, the capacitor having a negative third order derivative of charge with respect to voltage.

In some aspects, the techniques described herein relate to a switch circuit wherein the switch circuit has a total third order derivative of charge with respect to voltage corresponding to a sum of the positive third order derivative of charge with respect to voltage of the field effect transistor when the field effect transistor is in an off state and the negative third order derivative of charge with respect to voltage of the capacitor.

In some aspects, the techniques described herein relate to a switch circuit wherein the positive third order derivative of charge with respect to voltage of the field effect transistor when the field effect transistor is in an off state has an absolute value within 50 percent of an absolute value of the negative third order derivative of charge with respect to voltage of the capacitor.

In some aspects, the techniques described herein relate to a switch circuit wherein an absolute value of the positive third order derivative of charge with respect to voltage of the field effect transistor when the field effect transistor is in an off state is substantially the same as an absolute value of the negative third order derivative of charge with respect to voltage of the capacitor.

In some aspects, the techniques described herein relate to a switch circuit further including an input circuit and an output circuit, the input circuit including a signal generator connected to a first terminal of the field effect transistor and a first terminal of the capacitor, and the output circuit including a resistor connected to the first terminal of the capacitor.

In some aspects, the techniques described herein relate to a switch circuit wherein the field effect transistor has a second terminal connected to ground and the capacitor has a second terminal connected to ground.

In some aspects, the techniques described herein relate to a switch circuit wherein the field effect transistor is a shunt off field effect transistor.

In some aspects, the techniques described herein relate to a switch circuit wherein the capacitor is a metal-insulator-metal (MIM) capacitor.

In some aspects, the techniques described herein relate to a wireless communication device including: a radio frequency circuit including a linearizer circuit and a power amplifier circuit, the linearizer circuit including a first capacitor and a second capacitor arranged in parallel, the first capacitor having a positive third order derivative of charge with respect to voltage, the second capacitor having a negative third order derivative of charge with respect to voltage, and the power amplifier circuit including a power amplifier configured to amplify a radio frequency signal for transmission, the radio frequency circuit configured to reduce intermodulation distortion during operation of the power amplifier; and a switch circuit configured to electrically couple an output of the power amplifier to a selected filter of a filter circuit.

In some aspects, the techniques described herein relate to a wireless communication device wherein the linearizer circuit has a total third order derivative of charge with respect to voltage corresponding to a sum of the positive third order derivative of charge with respect to voltage of the first capacitor and the negative third order derivative of charge with respect to voltage of the second capacitor.

In some aspects, the techniques described herein relate to a wireless communication device wherein an absolute value of the positive third order derivative of charge with respect to voltage of the first capacitor is between 50% to 100% of an absolute value of the negative third order derivative of charge with respect to voltage of the second capacitor.

In some aspects, the techniques described herein relate to a wireless communication device further including a switch circuit and a capacitor, the switch circuit including a field effect transistor having a positive third order derivative of charge with respect to voltage when the field effect transistor is in an off state, and the capacitor arranged in parallel with the field effect transistor, the capacitor having a negative third order derivative of charge with respect to voltage.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
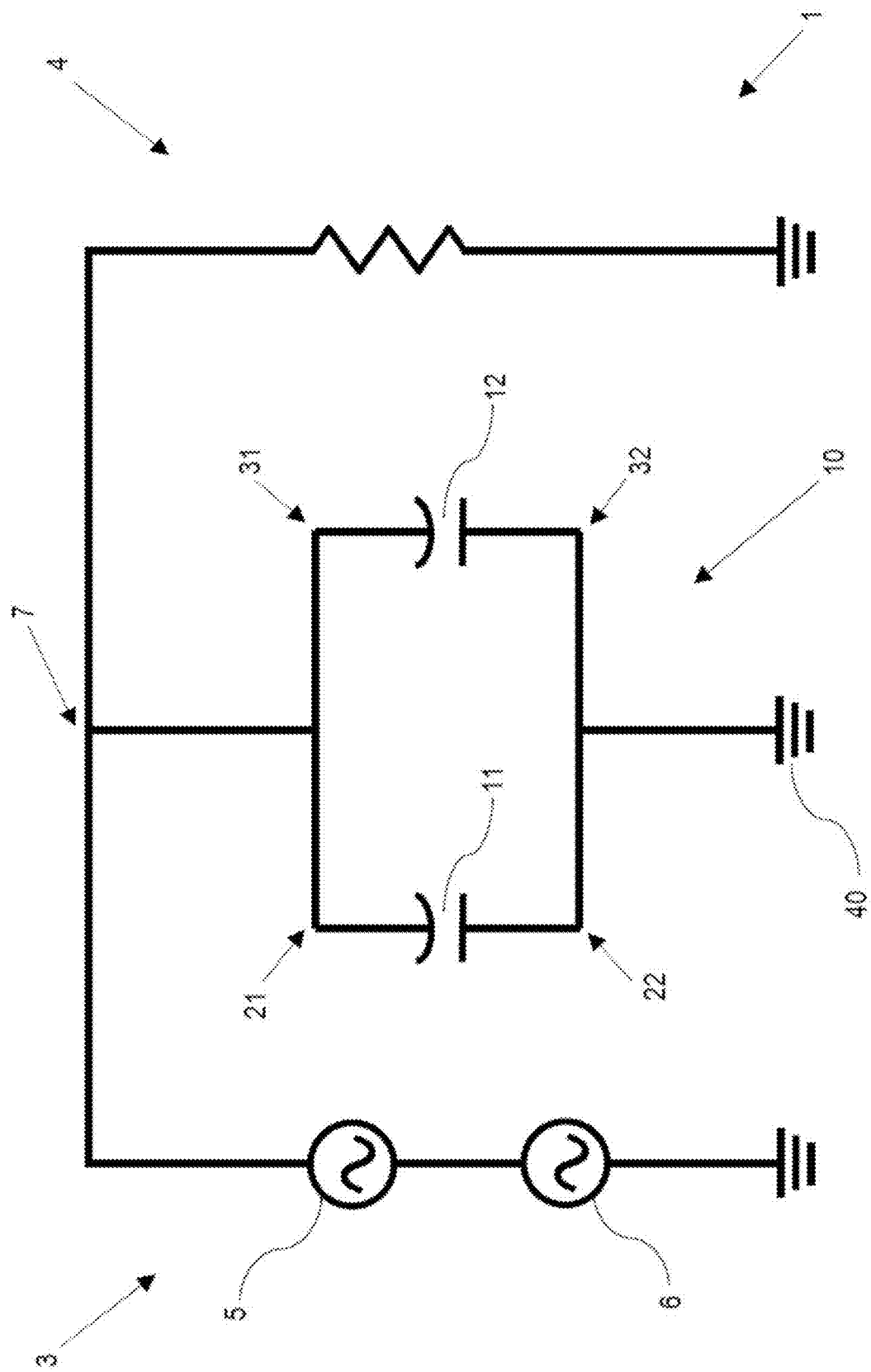
FIG. 1 is a schematic diagram of an example radio frequency circuit according to certain embodiments.

Aspects and embodiments described herein are directed to a radio frequency circuit comprising a linearizer circuit or a radio frequency circuit comprising a switch circuit. Aspects and embodiments described herein may also include one or more of a radio frequency power amplifier circuit, a radio frequency power mixer circuit, a radio frequency filter circuit, a radio frequency module and a wireless communication device incorporating one or more of said radio frequency circuits.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including." "comprising." "having." "containing," "involving." and variations thereof is meant to encompass the items listed thereafter and equivalents thereof as well as additional items. References to "or" may be construed as inclusive so that any terms described using "or" may indicate any of a single, more than one, and all of the described terms.

Intermodulation (IM) or intermodulation distortion (IMD) is a common problem, which can arise from one or more nonlinearities in a signal processing system. Linearity can be a significant performance parameter in RF circuits, for example, in a power amplifier system that is configured to transmit signals in a plurality of different frequency bands. As will be discussed in more detail below, embodiments of the present disclosure are configured to improve the linearity of components or portions of radio frequency circuits, and thus reduce the level of intermodulation distortion (IMD) experienced when using said radio frequency circuits, particularly a third order IMD (IMD3) of the radio frequency circuits.

IMD can result from two or more signals mixing together and yielding frequencies that are not harmonic frequencies. For example, suppose that two signals have fundamental frequencies f1 and f2 (f2>f1) that are relatively close to each other in frequency space. Mixing of such signals can result in peaks in frequency spectrum at frequencies corresponding to different products of fundamental and harmonic frequencies of the two signals. For example, a second-order intermodulation distortion (also referred to as IMD2) is typically considered to include frequencies f1+f2 f2-f1, 2f1, and 2f2. A third-order IMD (also referred to as IMD3) is typically considered to include 2f1+f2, 2f1-f2, f1+2f2, f1-2f2. Higher order products can be formed in similar manners.

In general, as the IMD order number increases, power levels decrease. Accordingly, second and third order IMD can cause undesirable effects that are of particular interest. Higher order IMD, such as fourth and fifth orders can also be of interest in some situations.

In some RF applications, it can be desirable to reduce susceptibility to interference within an RF system. Non-linearity in RF systems can result in an introduction of spurious signals into the system. Spurious signals in the RF system can result in interference within the system and degrade the information transmitted by RF signals. An RF system having increased non-linearity can demonstrate increased susceptibility to interference. Non-linearity in system components, for example switching devices, can contribute to the introduction of spurious signals into the RF system, thereby contributing to degradation of overall RF system linearity and IMD performance.

In some embodiments, RF switching devices can be implemented as part of an RF system including, for example, a wireless communication system. IMD performance of the system can be improved by increasing linearity of system components, such as linearity of an RF circuit or RF device. In some embodiments, a wireless communication system can operate in a multi-band and/or multi-mode environment. Improvement in intermodulation distortion (IMD) performance can be desirable in wireless communication systems operating in a multi-band and/or multi-mode environment. In some embodiments, improvement of a switching device IMD performance can improve the IMD performance of a wireless communication system operating in a multi-mode and/or multi-band environment.

Improved switching device IMD performance can be desirable for wireless communication devices operating in various wireless communication standards, for example for wireless communication devices operating in the LTE communication standard. In some RF applications, it can be desirable to improve linearity of switching devices operating in wireless communication devices that enable simultaneous transmission of data and voice communication. For example, improved IMD performance in switching devices can be desirable for wireless communication devices operating in the LTE communication standard and performing simultaneous transmission of voice and data communication (e.g., SVLTE).

As will be described in more detail below, in certain embodiments, there is provided a radio frequency circuit comprising a linearizer circuit. The linearizer circuit comprises a first capacitor and a second capacitor arranged in parallel. The first capacitor has a positive third order derivative of charge with respect to voltage. The second capacitor has a negative third order derivative of charge with respect to voltage.

By arranging for the first capacitor and the second capacitor to be positioned in parallel, the total capacitance (Tc) for the linearizer circuit may be the combined (or sum) capacitance of the first capacitor (C1) and the second capacitor (C2), i.e. Tc=C1+C2. However, through careful selection of a first capacitor whose third order derivative of charge with respect to voltage is positive, in combination with a second capacitor whose third order derivative of charge with respect to voltage is negative, it is possible to reduce the total third order derivative for the linearizer by virtue of this positive/negative offset. That is, the third order derivatives of charge with respect to voltage for the two capacitors act to offset one another to reduce the absolute value of the overall total third order derivative of charge with respect to voltage of the linearizer. This can help to improve the linearity of this portion of the radio frequency circuit and thus help to reduce the amount of third order intermodulation distortion (IMD3) experienced when using said radio frequency circuits.

A field effect transistor, when in an off state, may be considered to act as a capacitor. Consequently, the first capacitor of the linearizer may be an off-state field effect transistor.

Therefore, in certain embodiments, there is provided a radio frequency circuit comprising a switch circuit. The switch circuit comprises a field effect transistor and a capacitor arranged in parallel. The field effect transistor has a positive third order derivative of charge with respect to voltage. The capacitor has a negative third order derivative of charge with respect to voltage.

By arranging for the field effect transistor and the second capacitor to be positioned in parallel, when the field effect transistor is in an off state, the total capacitance ($TC_{FET}$) for the switch circuit may be the combined capacitance of the field effect transistor when in an off state ($C_{FET}$) and the capacitor (C2), i.e. $TC_{FET}=C_{FET}+C2$. However, through careful selection of a field effect transistor whose third order derivative of charge with respect to voltage is positive, in combination with a capacitor whose third order derivative of charge with respect to voltage is negative, it is possible to reduce the total third order derivative for the switch circuit by virtue of this positive/negative offset. That is, the third order derivatives of charge with respect to voltage for the field effect transistor and capacitor act to offset one another to reduce the absolute value of the overall total third order derivative of charge with respect to voltage of the switch circuit. This can help to improve the linearity of this portion of the radio frequency circuit and thus help to reduce the amount of third order intermodulation distortion (IMD3) experienced when using said radio frequency circuits.

Turning to FIG. 1, there is shown a radio frequency circuit 1 comprising a linearizer circuit 10. The linearizer circuit 10 comprises a first capacitor 11 and a second capacitor 12 arranged in parallel. The first capacitor 11 has a positive third order derivative of charge with respect to voltage. The second capacitor 12 has a negative third order derivative of charge with respect to voltage. In some cases, an absolute value of the positive third order derivative of charge with respect to voltage of the first capacitor 11 is substantially the same as an absolute value of the negative third order derivative of charge with respect to voltage of the second capacitor 12. In other cases, an absolute value of the positive third order derivative of charge with respect to voltage of the first capacitor 11 is between 50% to 100% of an absolute value of the negative third order derivative of charge with respect to voltage of the second capacitor 12. Further, in some cases, the closer in value the absolute value of the positive third order derivative of charge with respect to voltage of the first capacitor 11 is to the absolute value of the negative third order derivative of charge with respect to voltage of the second capacitor 12, the greater the reduction of intermodulation distortion that may be achieved as the negative third order derivative of charge with respect to voltage of the second capacitor 12 may offset the positive third order derivate of charge with respect to voltage of the first capacitor 11. The first capacitor 11 may be a metal-insulator-metal (MIM) capacitor. The second capacitor 12 may be a metal-insulator-metal (MIM) capacitor.

The radio frequency circuit 1 has an input 3 and an output 4, with the linearizer circuit 10 arranged therebetween. The input 3 may include an input circuit that comprises a first signal generator 5 configured to produce or relay a first signal into the radio frequency circuit 1, having a fundamental frequency f1. The input 3 also comprises a second signal generator 6 configured to produce or relay a second signal into the radio frequency circuit 1, having a fundamental frequency f2. The first signal generator 5 and the second signal generator 6 may represent any type of signal generator or source of signal that may be provided to a linearizer circuit 10. The output may include a resistor configured to generate an output voltage for the radio frequency circuit 1. In some cases, the output may include any other type of output circuit that may provide a signal to a subsequent circuit element, such as a switching circuit or filter.

The linearizer circuit 10 has a first terminal 7 arranged between the input 3 and the output 4 of the radio frequency circuit 1. The first capacitor 11 has a first terminal 21 connected to the first terminal 7 of the linearizer circuit 10, and the second capacitor 12 has a first terminal 31 connected to the first terminal 7 of the linearizer circuit 7. The first capacitor 11 has a second terminal 22 connected to ground 40, and the second capacitor 12 has a second terminal 32 connected to ground 40.

Figure 2:
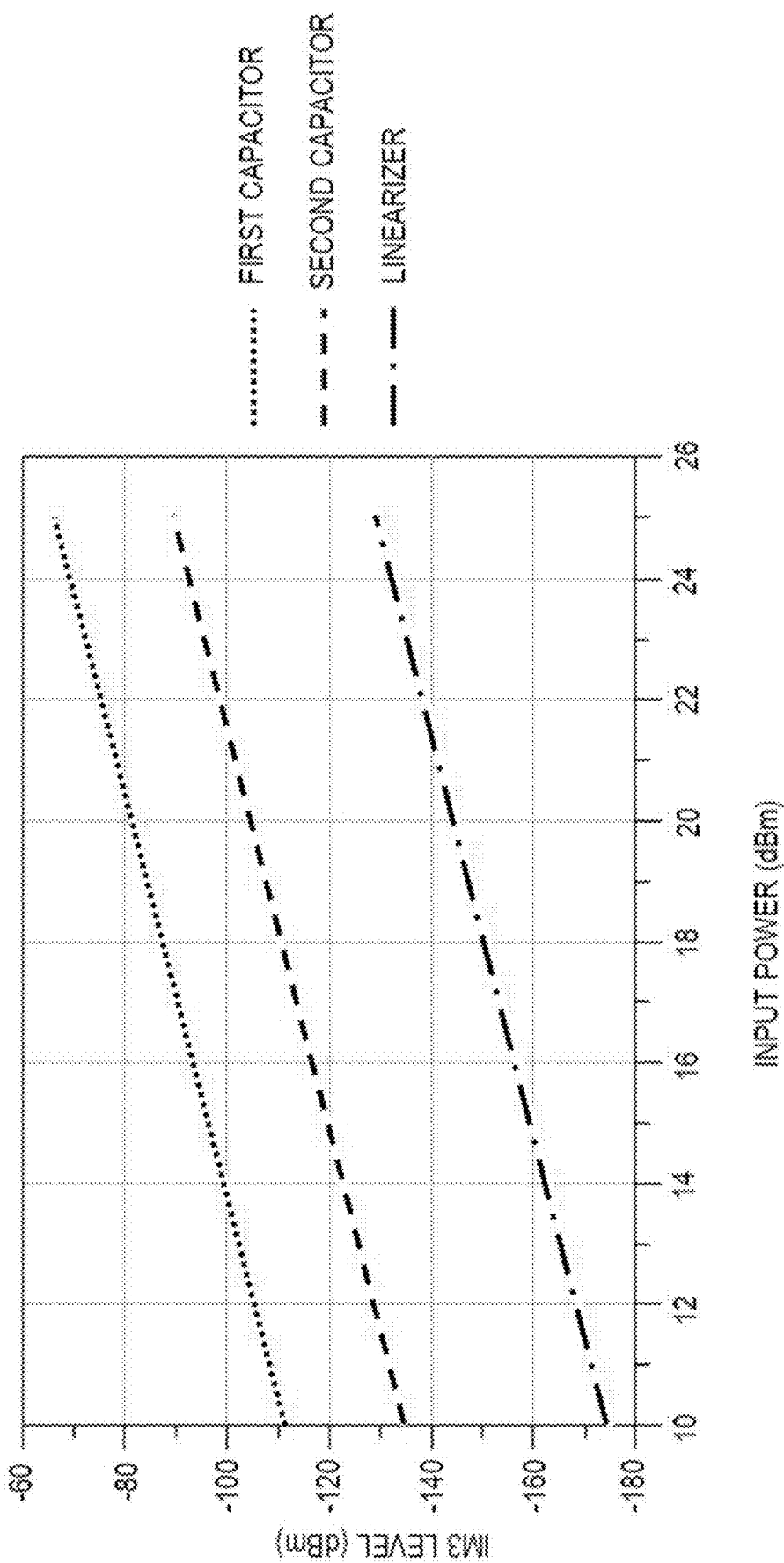
FIG. 2 is a graph showing IM3 plotted against input power for the capacitors of FIG. 1.

FIG. 2 is a graph plotting the third order intermodulation (IM3) level of each of the first capacitor 11, second capacitor 12 and linearizer circuit 10 against the input power of the radio frequency circuit 1. As can be seen from FIG. 2, the IM3 plot for the linearizer 10 is notably lower than the individual IM3 level of each of the first capacitor 11 and second capacitor 12. This effect is a result of the positive and negative arrangements of the third order derivative of charge with respect to voltage. Consequently, the first capacitor 11 and second capacitor 12 can act together to provide a desired combined capacitance level to the linearizer portion of the radio frequency circuit 1, and can also benefit from improved linearity due to the offsetting of their respective third order derivatives of charge with respect to voltage.

Figure 3A:
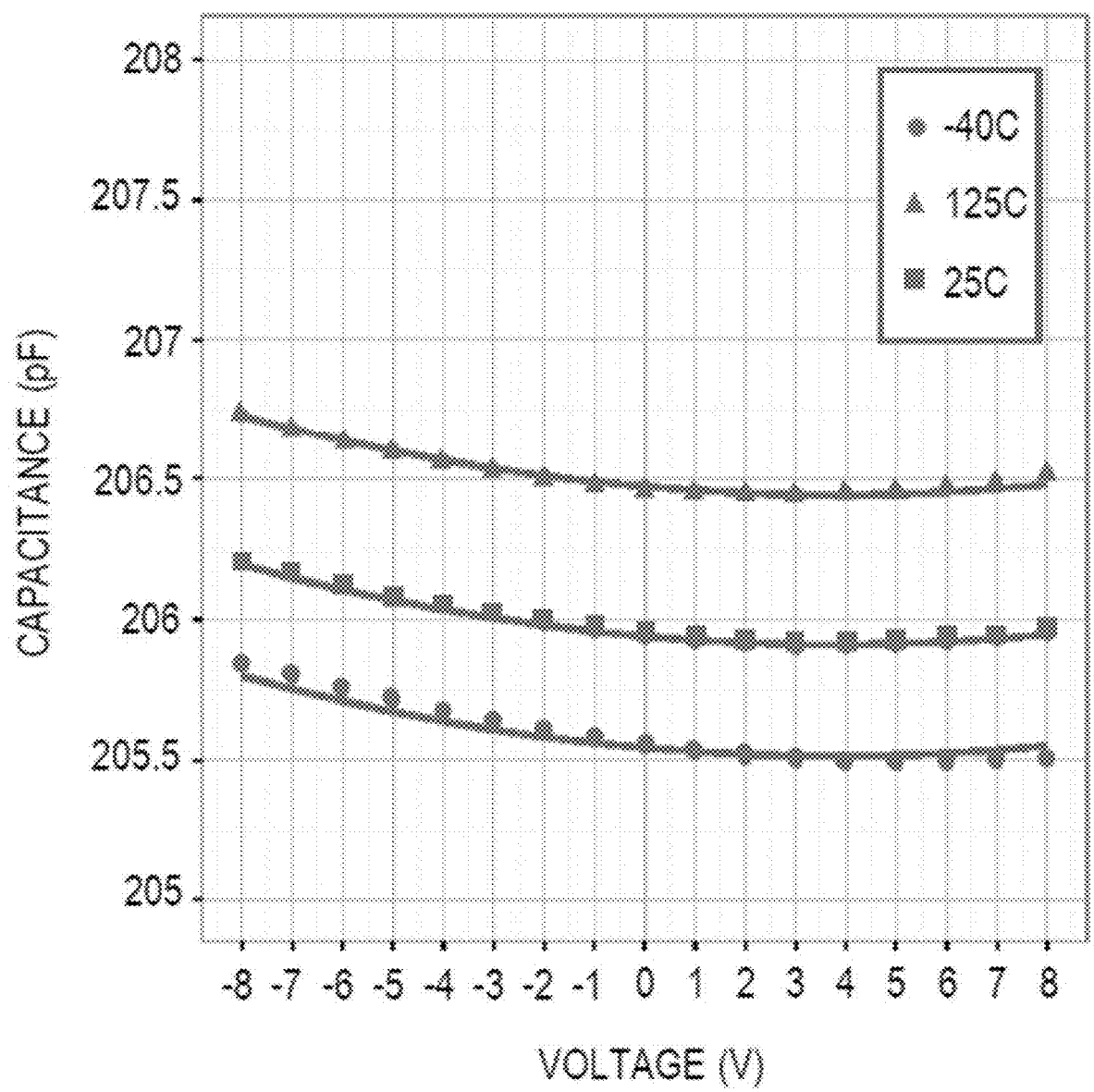
FIG. 3A is a graph showing capacitance plotted against voltage for the second capacitor of FIG. 1.
Figure 3B:
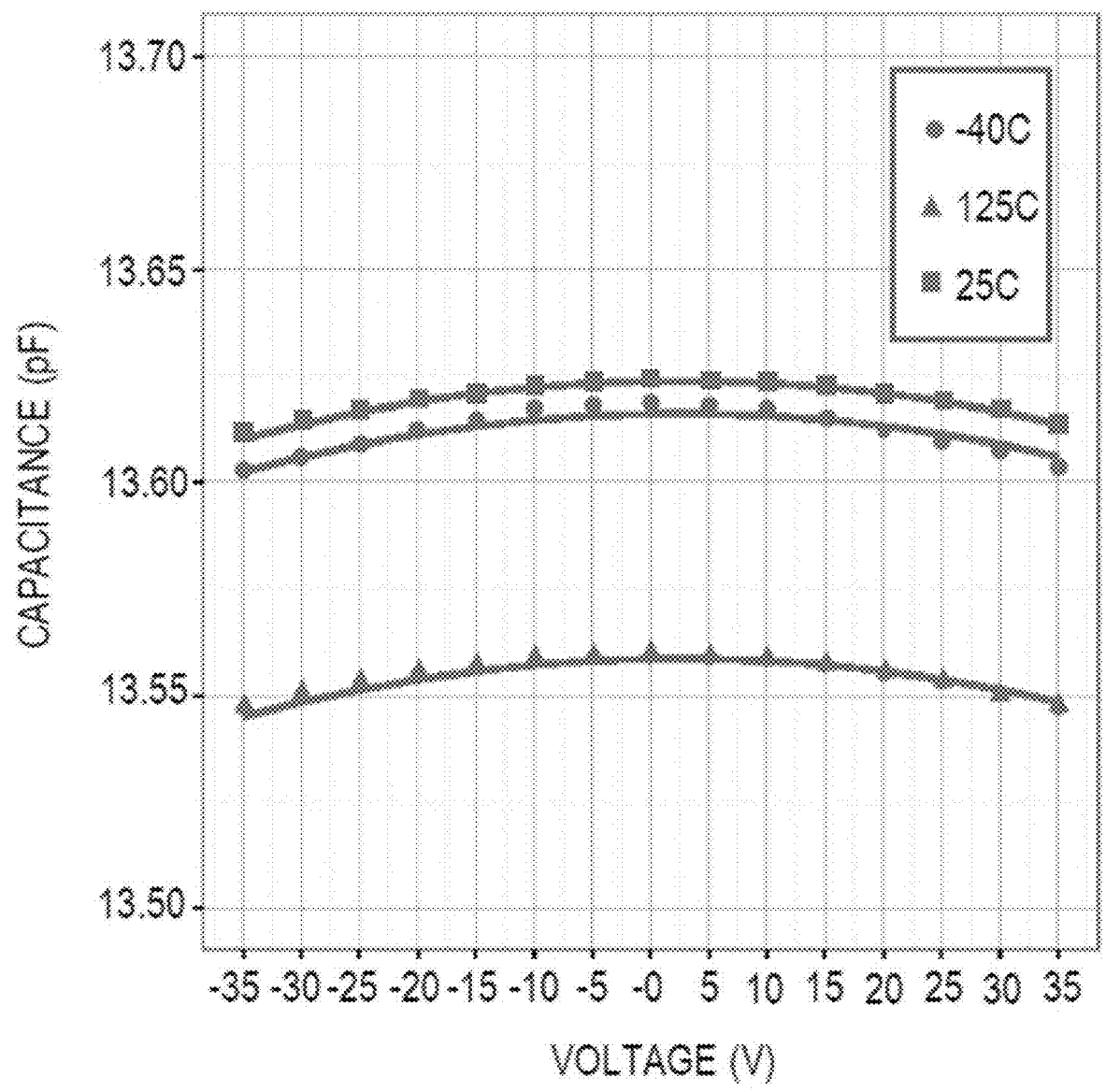
FIG. 3B is a graph showing capacitance plotted against voltage for the second capacitor of FIG. 1.

This effect can be further appreciated from FIG. 3A and FIG. 3B, which each show capacitance plotted against voltage for the first capacitor 11 and second capacitor 12 respectively. In particular, FIG. 3A depicts capacitance plotted against voltage for the first capacitor 11 at three different temperature levels; namely, −40 degrees Celsius, 125 degrees Celsius, and 25 degrees Celsius. For each plot, the level of capacitance can be seen to vary as the voltage is varied. This depicts inherent non-linearity in the performance of the first capacitor 11. The upwards shape of the parabola for each plot in FIG. 3A indicates that the first capacitor 11 has a positive third order derivative of charge with respect to voltage.

The converse situation can be seen in the plot of FIG. 3B, which depicts capacitance plotted against voltage for the second capacitor 12 at three different temperature levels; namely, −40 degrees Celsius, 125 degrees Celsius, and 25 degrees Celsius. Here, for each plot, the level of capacitance can be seen to vary as the voltage is varied, to thereby depict inherent non-linearity in the performance of the second capacitor 12. However, the downwards shape of the parabola for each plot in FIG. 3B indicates that the second capacitor 12 has a negative third order derivative of charge with respect to voltage.

Figure 4:
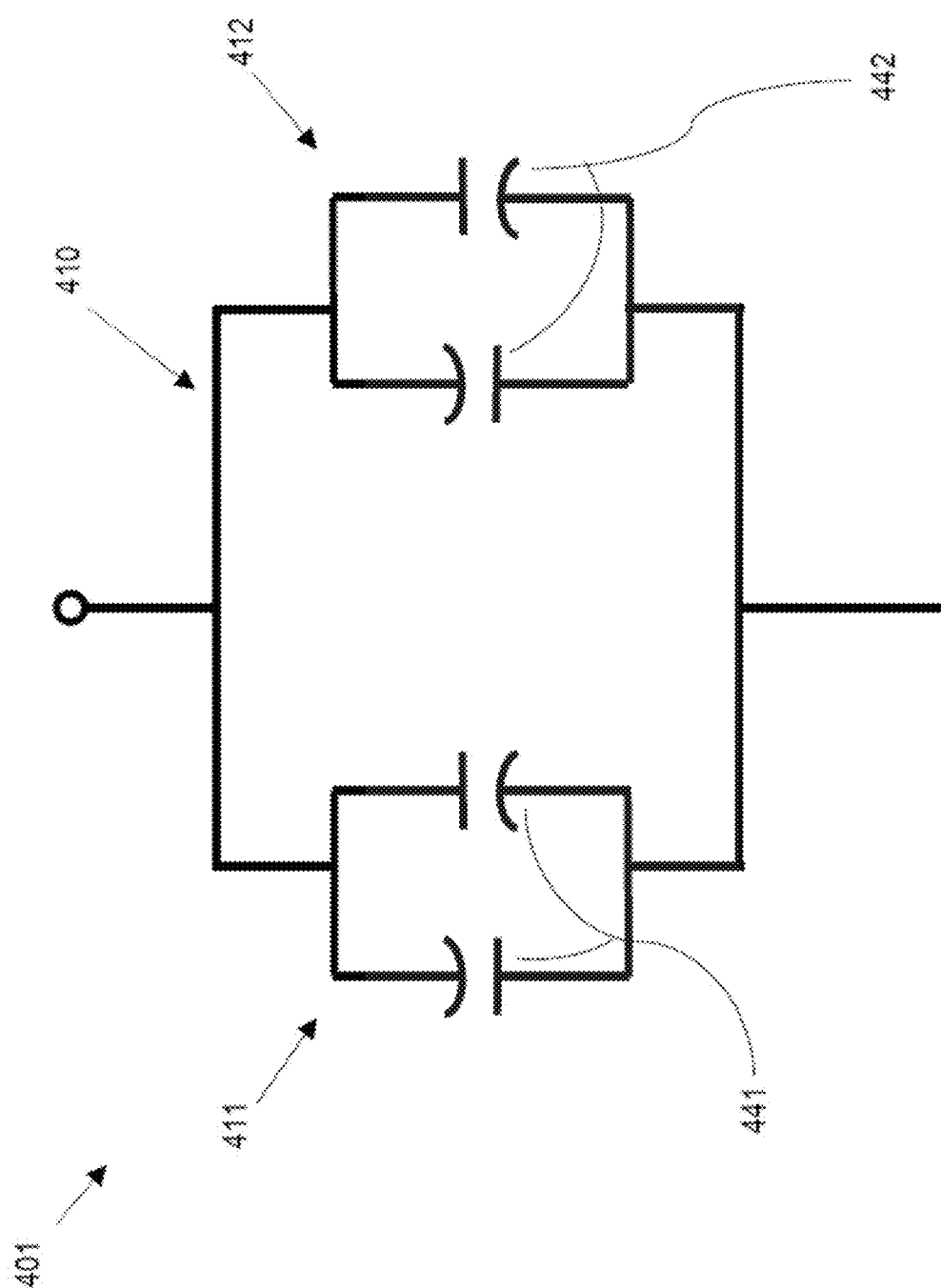
FIG. 4 is a schematic diagram of an example radio frequency circuit according to certain embodiments.

Turning to FIG. 4, there is shown a radio frequency circuit 401 comprising a linearizer circuit 410. The linearizer circuit 410 of FIG. 4 is similar to linearizer circuit 1 of FIG. 1, except that instead of the first capacitor 11 and second capacitor 12, the linearizer circuit 410 of FIG. 4 comprises a first capacitor group 411 and a second capacitor group 412 arranged in parallel. The first capacitor group 411 comprises a first pair of polarized capacitors 441 arranged anti-parallel to one another. Similarly, the second capacitor group 412 comprises a second pair of polarized capacitors 442 arranged anti-parallel to one another.

By arranging for the first pair of polarized capacitors 441 to be anti-parallel to one another, the second order distortion attributed to the first capacitor group 411 can be reduced. Similarly, by arranging for the second pair of polarized capacitors 442 to be anti-parallel to one another, the second order distortion attributed to the second capacitor group 412 can be reduced.

Furthermore, in a similar manner to the arrangement of FIG. 1, in the arrangement of FIG. 4, the third order derivative of charge with respect to voltage of the first capacitor group 411 is positive, whilst the third order derivative of charge with respect to voltage of the second capacitor group 412 is negative. Consequently, the third order derivatives of charge with respect to voltage for the two capacitors groups 411, 412 act to offset one another to reduce the absolute value of the overall total third order derivative of charge with respect to voltage of the linearizer circuit 410. This can help to improve the linearity of this portion of the radio frequency circuit 401 and thus help to reduce the amount of third order intermodulation distortion (IMD3) experienced when using said radio frequency circuit 401.

Figure 5:
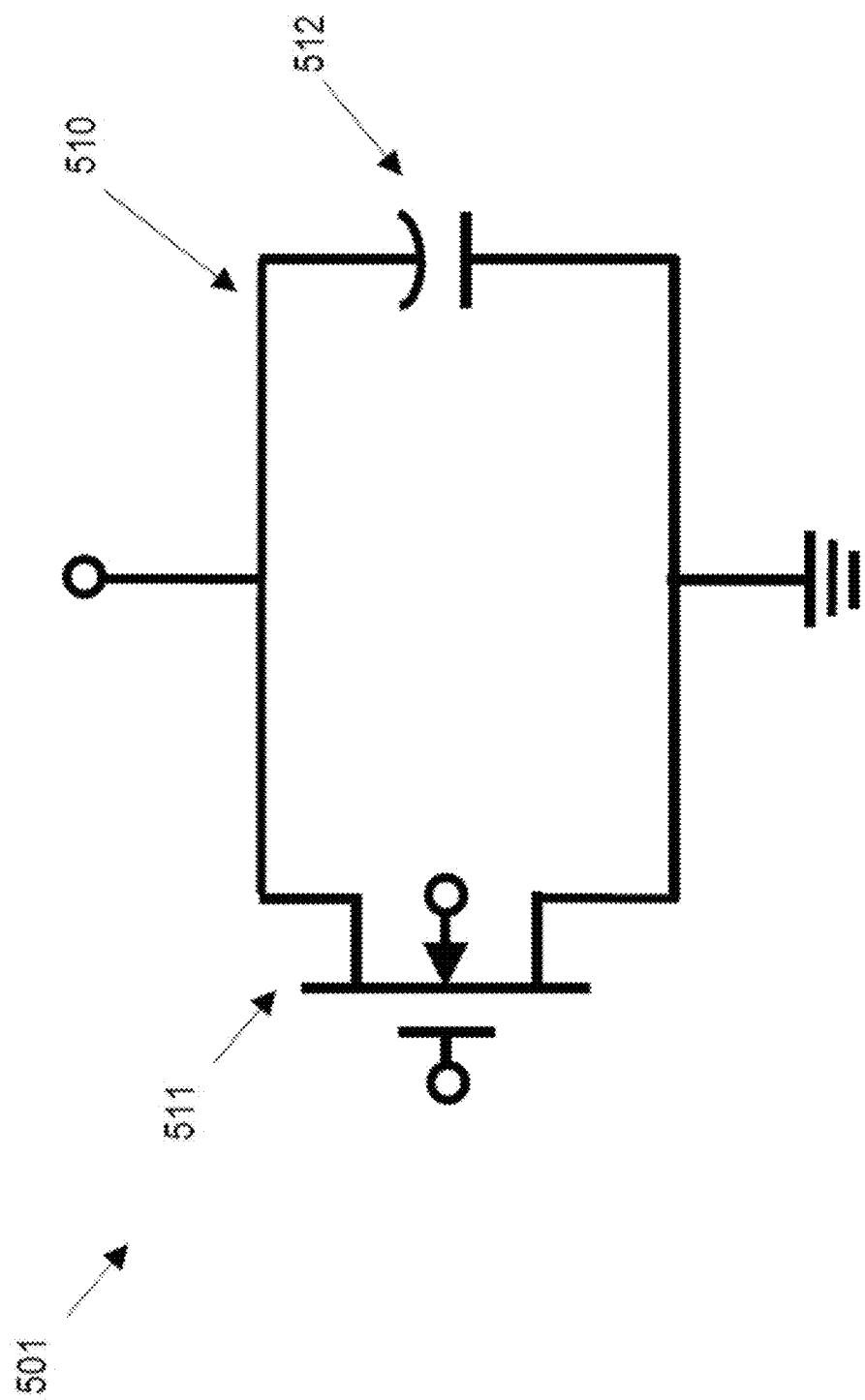
FIG. 5 is a schematic diagram of an example radio frequency circuit according to certain embodiments

Turning to FIG. 5, there is shown a radio frequency circuit 501 comprising a switch circuit 510. The switch circuit 510 of FIG. 5 is similar to linearizer circuit 1 of FIG. 1, except that instead of a first MIM capacitor 11, the switch circuit 510 of FIG. 5 comprises a field effect transistor 511. The field effect transistor 511 is a metal-oxide semiconductor field-effect transistor (MOSFET). The field effect transistor 511 may be configured to act as a switch for the frequency circuit 501, such as a shunt off switch.

The field effect transistor 511 in FIG. 5 is arranged in parallel to a capacitor 512, which may be equivalent to the second capacitor 12 of FIG. 1 or the second capacitor group 512 of FIG. 4. The field effect transistor 511 has a positive third order derivative of charge with respect to voltage when the field effect transistor is in an off state. The capacitor 512 has a negative third order derivative of charge with respect to voltage.

Consequently, the third order derivatives of charge with respect to voltage for the field effect transistor 511 and the capacitor 512 act to offset one another to reduce the absolute value of the overall total third order derivative of charge with respect to voltage of the switch circuit 510. This can help to improve the linearity of this portion of the radio frequency circuit 501 and thus help to reduce the amount of third order intermodulation distortion (IMD3) experienced when using said radio frequency circuit 501. Put another way, when used as a switch in the radio frequency circuit 501, the field effect transistor 511 may carry an inherent capacitance when placed in the off state. This capacitance, and in particular, any nonlinear properties introduced to the system by this capacitance may undesirably lead to distortion. To compensate for such inherent nonlinearity in the field effect transistor 511, a specifically selected capacitor 512 may be placed alongside the field effect transistor 511 in the switch circuit 510 in parallel. By arranging for this capacitor 512 to have a negative third order derivative of charge with respect to voltage, the extent of third order intermodulation distortion introduced into the system by the field effect transistor 511 can be reduced.

It should be appreciated that the radio frequency circuits 1, 401, 501 illustrated in FIGS. 1, 4 and 5, as well as the other circuit elements illustrated in other figures presented herein, are illustrated in a highly simplified form. The relative dimensions of the different features are not shown to scale. Further, radio frequency circuits can commonly include a far greater number of electronic components than illustrated.

The radio frequency circuits described herein can be included in a wafer-level package. A wafer-level package refers to an integrated circuit that is packaged while still part of a wafer, as opposed to separating the wafer into individual dies and packaging each die separately. The resulting wafer-level package is a chip-scale package because the package is the same size as, or only marginally larger than, the size of the die. The integrated circuit can include a radio frequency circuit.

Figure 6:
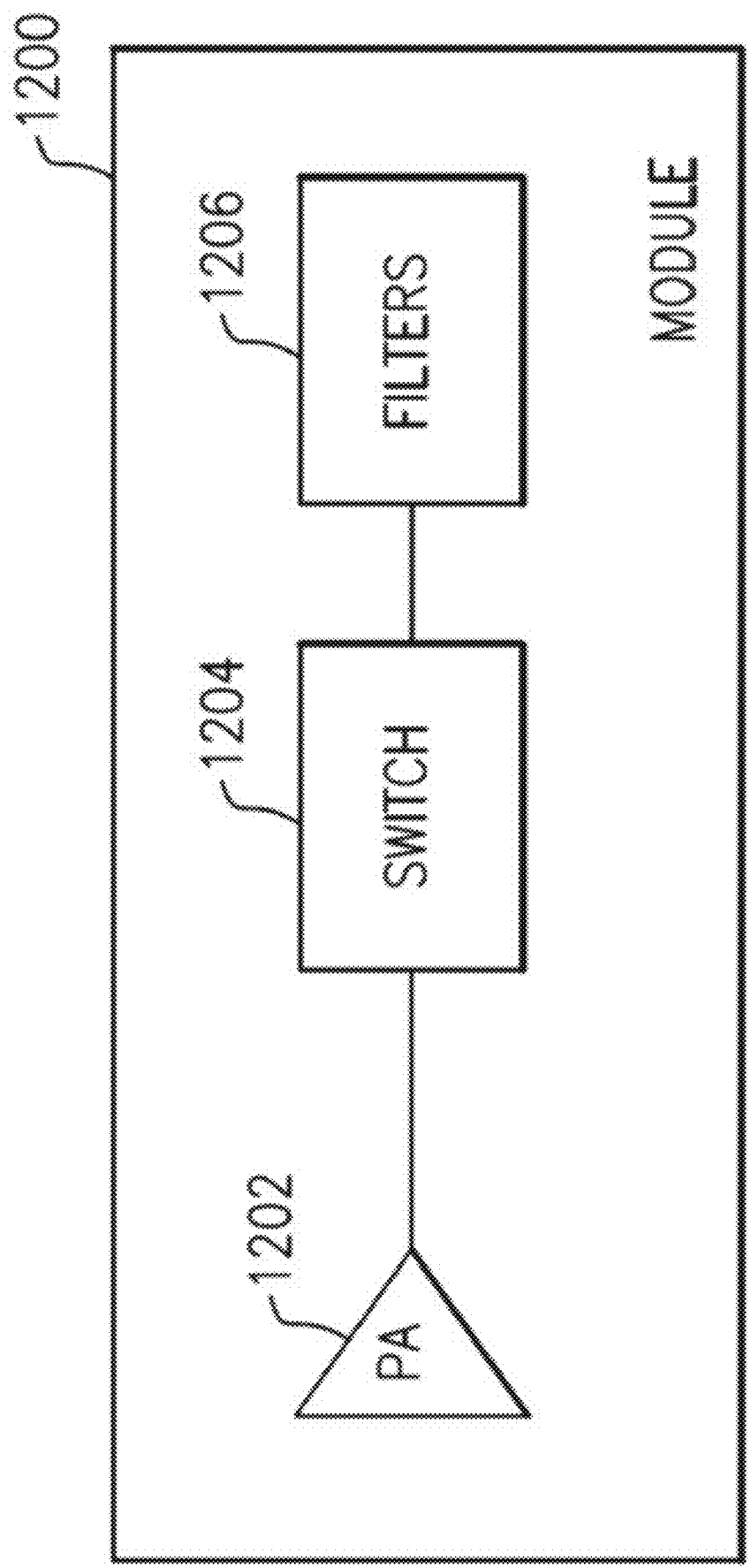
FIG. 6 is a schematic block diagram of a module that includes a power amplifier, a switch, and filters according to certain aspects of the present disclosure.
Figure 7:
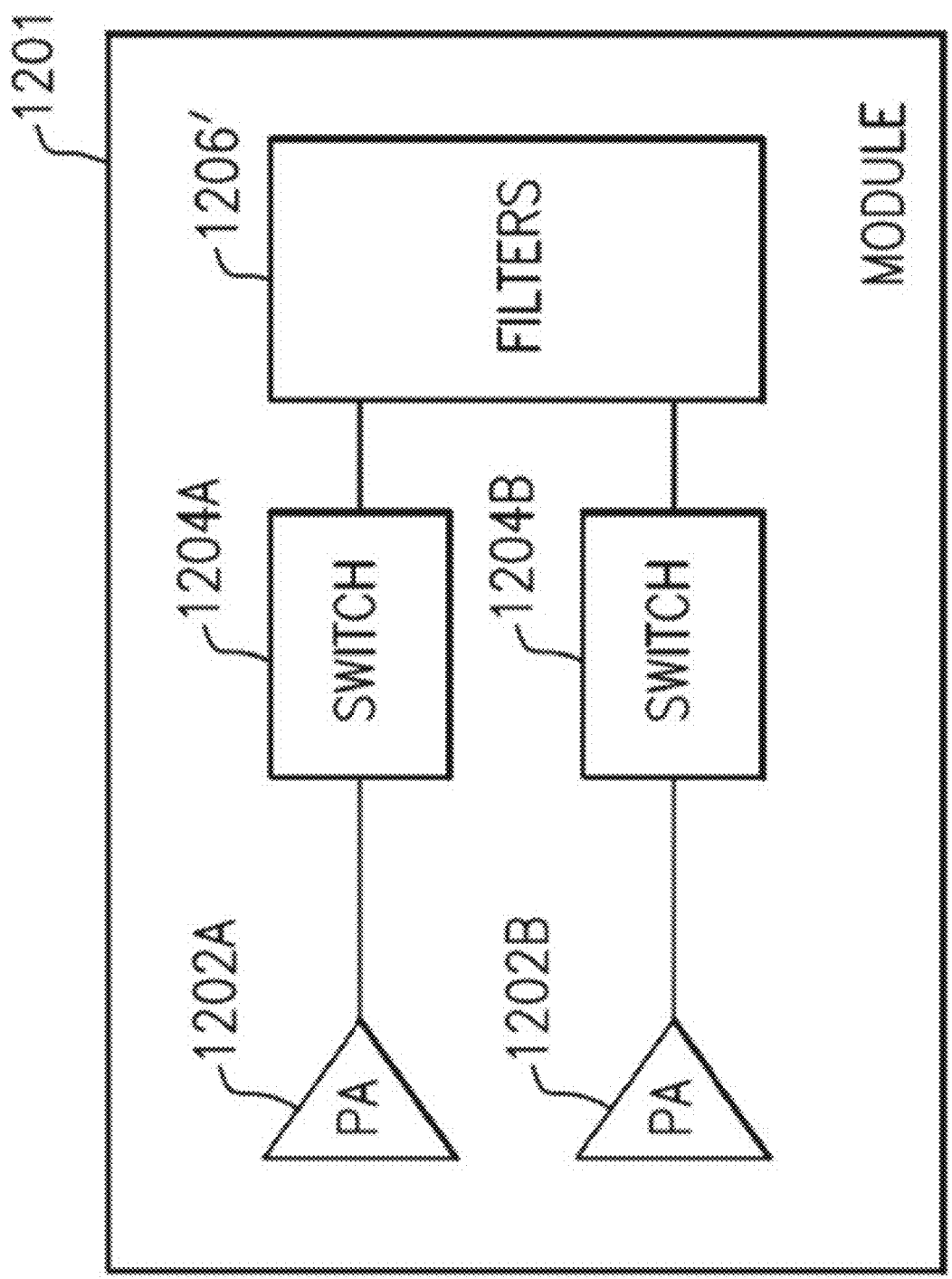
FIG. 7 is a schematic block diagram of a module that includes power amplifiers, switches, and filters according to certain aspects of the present disclosure.
Figure 8:
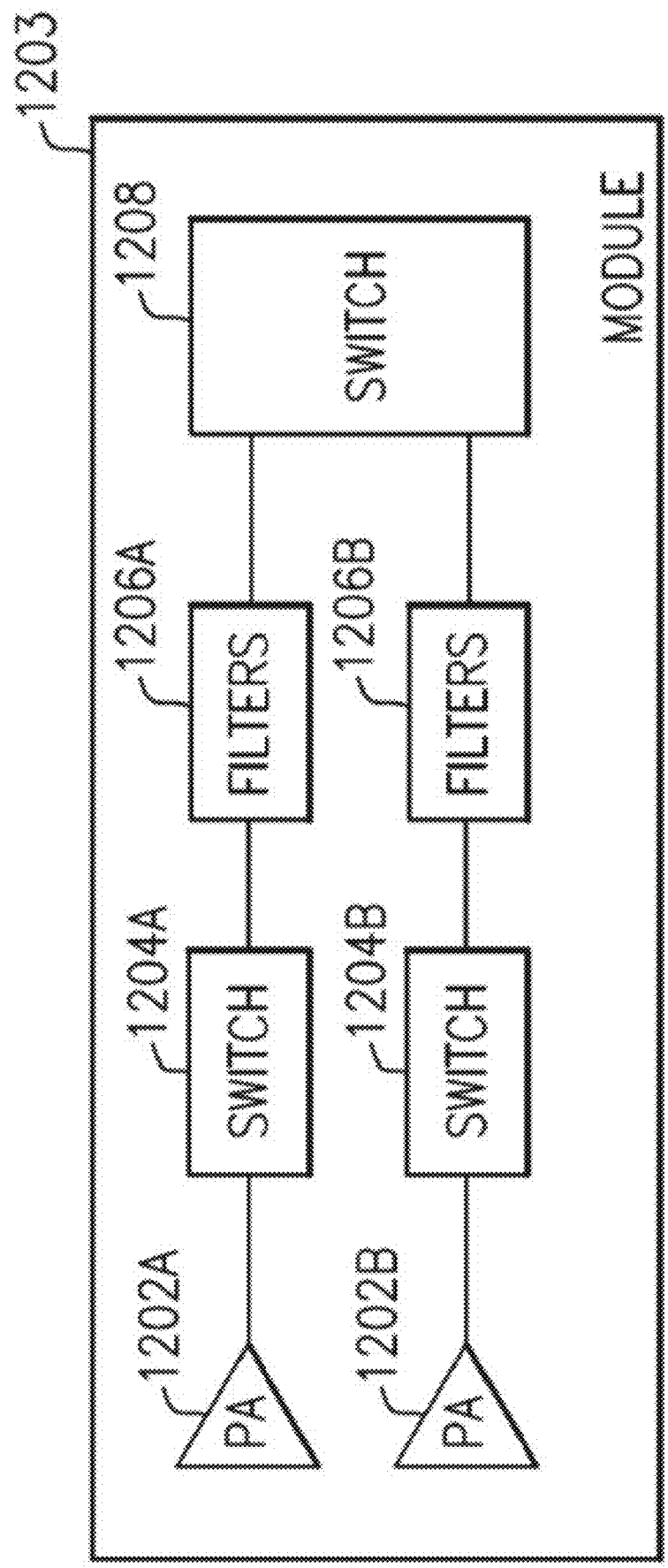
FIG. 8 is a schematic block diagram of a module that includes power amplifiers, switches, filters, and an antenna switch according to certain aspects of the present disclosure.

The radio frequency circuits discussed herein can be implemented in a variety of modules. Some example modules will now be discussed in which any suitable principles and advantages of the radio frequency circuits discussed herein can be implemented. FIGS. 6, 7, and 8 are schematic block diagrams of illustrative modules according to certain embodiments. A module arranged to process a radio frequency signal can be referred to as a radio frequency (RF) module.

FIG. 6 is a schematic block diagram of a module 1200 that includes a power amplifier 1202, a switch 1204, and filters 1206. Each of the power amplifier 1202, switch 1204, and filters 1206 may include one or more radio frequency circuits or linearizer circuits in accordance with one or more embodiments described herein, such as radio frequency circuits 1, 401, and/or 501.

The module 1200 can include a package that encloses the illustrated elements. The power amplifier 1202, the switch 1204, and the filters 1206 can be disposed on a common packaging substrate. The packaging substrate can be a laminate substrate, for example. The power amplifier 1202 can amplify a radio frequency signal. The power amplifier 1202 can include a gallium arsenide bipolar transistor in certain applications. The switch 1204 can be a multi-throw radio frequency switch. The switch 1204 can electrically couple an output of the power amplifier 1202 to a selected filter of the filters 1206. The filters 1206 can include any suitable number of surface acoustic wave filters and/or other acoustic wave filters. One or more of the power amplifier 1202, switch 1204, and filters 1206 can be implemented in accordance with any suitable principles and advantages of the radio frequency circuits discussed herein, such as radio frequency circuits 1, 401 and 501.

FIG. 7 is a schematic block diagram of a module 1201 that includes power amplifiers 1202A and 1202B, switches 1204A and 1204B, and filters 1206', comprising one or more radio frequency circuits in accordance with one or more embodiments, such as radio frequency circuits 1, 401 and 501. The module 1201 is like the module 1200 of FIG. 6, except that the module 1201 includes an additional power amplifier 1202B and an additional switch 1204B and the filters 1206' are arranged to filter signals for the signal paths associated with a plurality of power amplifiers 1202A and 1202B. The different signal paths can be associated with different frequency bands and/or different modes of operation (e.g. different power modes, different signaling modes, etc.).

FIG. 8 is a schematic block diagram of a module 1203 that includes power amplifiers 1202A and 1202B, switches 1204A and 1204B, and filters 1206A and 1206B, comprising one or more radio frequency circuits in accordance with one or more embodiments, such as radio frequency circuits 1, 401 and 501. The module 1203 is like the module 1201 of FIG. 7, except the module 1203 includes an antenna switch 1208 arranged to selectively couple a signal from the filters 1206A or the filters 1206B to an antenna node. The filters 1206A and 1206B can correspond to the filters 1206' of FIG. 7.

Figure 9:
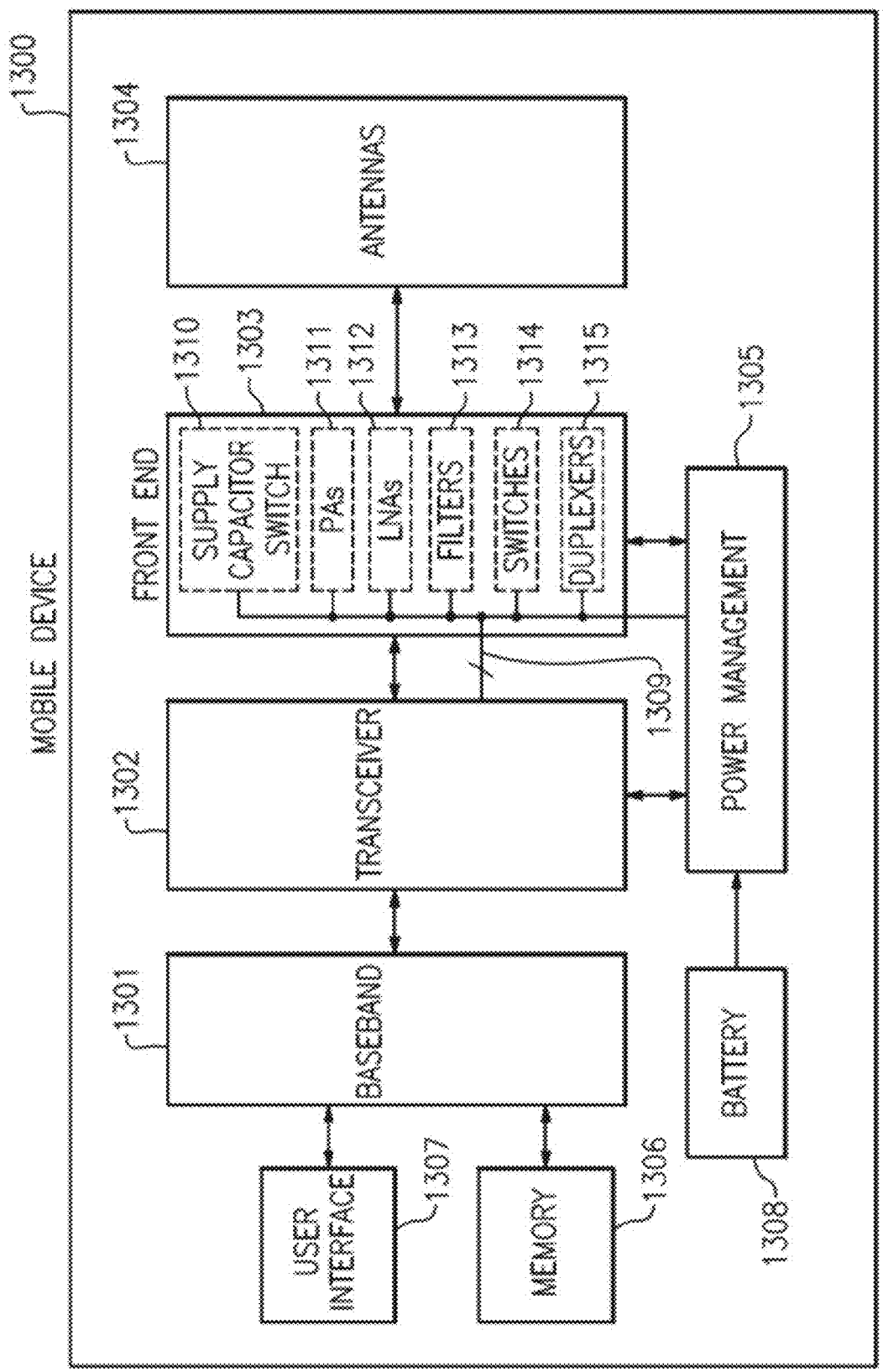
FIG. 9 is a schematic diagram of certain embodiments of a wireless communication device.

FIG. 9 is a schematic diagram of one embodiment of a wireless communication device or mobile device 1300. The mobile device 1300 includes a baseband system 1301, a transceiver 1302, a front end system 1303, antennas 1304, a power management system 1305, a memory 1306, a user interface 1307, and a battery 1308.

Although the mobile device 1300 illustrates one example of an RF system that can include one or more features of the present disclosure, the teachings herein are applicable to electronic systems implemented in a wide variety of ways.

The mobile device 1300 can be used to communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and Zig-Bee), WMAN (for instance, WiMax), and/or GPS technologies.

The transceiver 1302 generates RF signals for transmission and processes incoming RF signals received from the antennas 1304. It will be understood that various functionalities associated with the transmission and receiving of RF signals can be achieved by one or more components that are collectively represented in FIG. 9 as the transceiver 1302. In certain examples, separate components (for instance, separate circuits or dies) can be provided for handling certain types of RF signals.

As shown in in FIG. 9, the transceiver 1302 is connected to the front end system 1303 and to the power management circuit 1305 using a serial interface 1309. All or part of the illustrated RF components can be controlled by the serial interface 1309 to configure the mobile device 1300 during initialization and/or while fully operational. In certain embodiments, the baseband processor 1301 is additionally or alternative connected to the serial interface 1309 and operates to configure one or more RF components, such as components of the front end system 1303 and/or power management system 1305.

The front end system 1303 aids in conditioning signals transmitted to and/or received from the antennas 1304. In the illustrated embodiment, the front end system 1303 includes one or more bias control circuits 1310 for controlling power amplifier biasing, one or more power amplifiers (PAs) 1311, one or more low noise amplifiers (LNAs) 1312, one or more filters 1313, one or more switches 1314, and one or more duplexers 1315. However, other implementations are possible.

For example, the front end system 1303 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1300 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 1304 can include antennas used for a wide variety of types of communications. For example, the antennas 1304 can include antennas for transmitting and/or receiving signals associated with a wide variety of frequencies and communications standards.

In certain implementations, the antennas 1304 support multiple-input and multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1300 can operate with beamforming in certain implementations. For example, the front end system 1303 can include phase shifters having variable phase controlled by the transceiver 1302. Additionally, the phase shifters are controlled to provide beam formation and directivity for transmission and/or reception of signals using the antennas 1304. For example, in the context of signal transmission, the phases of the transmit signals provided to the antennas 1304 are controlled such that radiated signals from the antennas 1304 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1304 from a particular direction. In certain implementations, the antennas 1304 include one or more arrays of antenna elements to enhance beamforming.

The baseband system 1301 is coupled to the user interface 1307 to facilitate processing of various user input and output (I/O), such as voice and data. The baseband system 1301 provides the transceiver 1302 with digital representations of transmit signals, which the transceiver 1302 processes to generate RF signals for transmission. The baseband system 1301 also processes digital representations of received signals provided by the transceiver 1302. As shown in FIG. 9, the baseband system 1301 is coupled to the memory 1306 to facilitate operation of the mobile device 1300.

The memory 1306 can be used for a wide variety of purposes, such as storing data and/or instructions to facilitate the operation of the mobile device 1300 and/or to provide storage of user information.

The power management system 1305 provides a number of power management functions of the mobile device 1300. In certain implementations, the power management system 1305 includes a power amplifier (PA) supply control circuit that controls the supply voltages of the power amplifiers 1311. For example, the power management system 1305 can be configured to change the supply voltage(s) provided to one or more of the power amplifiers 1311 to improve efficiency, such as power added efficiency (PAE).

The power management system 1305 can operate in a selectable supply control mode, such an average power tracking (APT) mode or an envelope tracking (ET) mode. In the illustrated embodiment, the selected supply control mode of the power management system 1305 is controlled by the transceiver 1302. In certain implementations, the transceiver 1302 controls the selected supply control mode using the serial interface 1309.

As shown in FIG. 9, the power management system 1305 receives a battery voltage from the battery 1308. The battery 1308 can be any suitable battery for use in the mobile device 1300, including, for example, a lithium-ion battery. Although the power management system 1305 is illustrated as separate from the front end system 1303, in certain implementations all or part (for instance, a PA supply control circuit) of the power management system 1305 is integrated into the front end system 1303.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

Unless the context clearly requires otherwise, throughout the description and the claims, the words "comprise." "comprising." and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the inventions are not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. A radio frequency circuit comprising:
   a radio frequency module including a linearizer circuit, the linearizer circuit including a first capacitor and a second capacitor arranged in parallel, the first capacitor having a positive third order derivative of charge with respect to voltage, the second capacitor having a negative third order derivative of charge with respect to voltage; and
   a power amplifier circuit including a power amplifier configured to amplify a radio frequency signal for transmission, the radio frequency module configured to reduce intermodulation distortion during operation of the power amplifier.

2. The radio frequency circuit of claim 1 wherein the linearizer circuit has a total third order derivative of charge with respect to voltage corresponding to a sum of the positive third order derivative of charge with respect to voltage of the first capacitor and the negative third order derivative of charge with respect to voltage of the second capacitor.

3. The radio frequency circuit of claim 1 wherein the positive third order derivative of charge with respect to voltage of the first capacitor has an absolute value within 50 percent of an absolute value of the negative third order derivative of charge with respect to voltage of the second capacitor.

4. The radio frequency circuit of claim 1 wherein an absolute value of the positive third order derivative of charge with respect to voltage of the first capacitor is substantially the same as an absolute value of the negative third order derivative of charge with respect to voltage of the second capacitor.

5. The radio frequency circuit of claim 1 further comprising an input circuit and an output circuit, the linearizer circuit having a first terminal arranged between the input circuit and the output circuit, the first capacitor having a first terminal connected to the first terminal of the linearizer circuit, and the second capacitor having a first terminal connected to the first terminal of the linearizer circuit.

6. The radio frequency circuit of claim 5 wherein the first capacitor has a second terminal connected to ground, and the second capacitor has a second terminal connected to ground.

7. The radio frequency circuit of claim 1 wherein the first capacitor is a metal-insulator-metal (MIM) capacitor and the second capacitor is a metal-insulator-metal (MIM) capacitor.

8. The radio frequency circuit of claim 1 wherein the first capacitor is one of a first pair of polarized capacitors arranged anti-parallel to one another, and the second capacitor is one of a second pair of polarized capacitors arranged anti-parallel to one another.

9. A switch circuit comprising:
   a field effect transistor having a positive third order derivative of charge with respect to voltage when the field effect transistor is in an off state; and
   a capacitor arranged in parallel with the field effect transistor, the capacitor having a negative third order derivative of charge with respect to voltage.

10. The switch circuit of claim 9 wherein the switch circuit has a total third order derivative of charge with respect to voltage corresponding to a sum of the positive third order derivative of charge with respect to voltage of the field effect transistor when the field effect transistor is in an off state and the negative third order derivative of charge with respect to voltage of the capacitor.

11. The switch circuit of claim 9 wherein the positive third order derivative of charge with respect to voltage of the field effect transistor when the field effect transistor is in an off state has an absolute value within 50 percent of an absolute value of the negative third order derivative of charge with respect to voltage of the capacitor.

12. The switch circuit of claim 9 wherein an absolute value of the positive third order derivative of charge with respect to voltage of the field effect transistor when the field effect transistor is in an off state is substantially the same as an absolute value of the negative third order derivative of charge with respect to voltage of the capacitor.

13. The switch circuit of claim 9 further comprising an input circuit and an output circuit, the input circuit including a signal generator connected to a first terminal of the field effect transistor and a first terminal of the capacitor, and the output circuit including a resistor connected to the first terminal of the capacitor.

14. The switch circuit of claim 13 wherein the field effect transistor has a second terminal connected to ground and the capacitor has a second terminal connected to ground.

15. The switch circuit of claim 9 wherein the field effect transistor is a shunt off field effect transistor.

16. The switch circuit of claim 9 wherein the capacitor is a metal-insulator-metal (MIM) capacitor.

17. A wireless communication device comprising:
a radio frequency circuit including a linearizer circuit and a power amplifier circuit, the linearizer circuit including a first capacitor and a second capacitor arranged in parallel, the first capacitor having a positive third order derivative of charge with respect to voltage, the second capacitor having a negative third order derivative of charge with respect to voltage, and the power amplifier circuit including a power amplifier configured to amplify a radio frequency signal for transmission, the radio frequency circuit configured to reduce intermodulation distortion during operation of the power amplifier; and
a switch circuit configured to electrically couple an output of the power amplifier to a selected filter of a filter circuit.

18. The wireless communication device of claim 17 wherein the linearizer circuit has a total third order derivative of charge with respect to voltage corresponding to a sum of the positive third order derivative of charge with respect to voltage of the first capacitor and the negative third order derivative of charge with respect to voltage of the second capacitor.

19. The wireless communication device of claim 17 wherein an absolute value of the positive third order derivative of charge with respect to voltage of the first capacitor is between 50% to 100% of an absolute value of the negative third order derivative of charge with respect to voltage of the second capacitor.

20. The wireless communication device of claim 17 further comprising a switch circuit and a capacitor, the switch circuit including a field effect transistor having a positive third order derivative of charge with respect to voltage when the field effect transistor is in an off state, and the capacitor arranged in parallel with the field effect transistor, the capacitor having a negative third order derivative of charge with respect to voltage.

* * * * *